US012677376B2

(12) United States Patent
Yamamoto et al.

(10) Patent No.: US 12,677,376 B2
(45) Date of Patent: *Jul. 7, 2026

(54) ADHESIVE COMPOSITION, THERMOSETTING ADHESIVE SHEET, AND PRINTED WIRING BOARD

(71) Applicant: DEXERIALS CORPORATION, Shimotsuke (JP)

(72) Inventors: Jun Yamamoto, Shimotsuke (JP); Toshiyuki Minegishi, Shimotsuke (JP); Kazuhiro Date, Shimotsuke (JP)

(73) Assignee: DEXERIALS CORPORATION, Shimotsuke (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/629,932

(22) PCT Filed: Aug. 2, 2019

(86) PCT No.: PCT/JP2019/030600

§ 371 (c)(1),
(2) Date: Jan. 25, 2022

(87) PCT Pub. No.: WO2021/024328

PCT Pub. Date: Feb. 11, 2021

(65) Prior Publication Data

US 2022/0298396 A1      Sep. 22, 2022

(51) Int. Cl.
*H05K 3/303*      (2026.01)
*B32B 7/12*      (2006.01)
(Continued)

(52) U.S. Cl.
CPC .............. *H05K 3/305* (2013.01); *C09J 7/255* (2018.01); *C09J 7/35* (2018.01); *C09J 7/381* (2018.01);
(Continued)

(58) Field of Classification Search
None
See application file for complete search history.

(56) References Cited

U.S. PATENT DOCUMENTS 6,558,790 B1 *  5/2003  Holguin ..................... C09J 4/00
                                                    428/317.1
7,595,362 B2 *  9/2009  Kawabe ................ C08L 51/003
                                                    525/391
(Continued)

FOREIGN PATENT DOCUMENTS

CN        106536658 A       3/2017
JP      2004-231781 A   *   8/2004
(Continued)

OTHER PUBLICATIONS

TUFTEC—Asashi Kasei (2015) (Year: 2015).*
(Continued)

*Primary Examiner* — Vivian Chen

(74) *Attorney, Agent, or Firm* — Oliff PLC

(57)      ABSTRACT

An adhesive composition has a low dielectric constant, a low dielectric loss tangent, and an excellent folding endurance. The adhesive composition includes: with respect to the total of 100 parts by mass of the adhesive composition, 75 to 90 parts by mass of a styrene elastomer; 3 to 25 parts by mass of a modified polyphenyleneether resin having a polymerizable group at an end; and totally 10 parts by mass or less of an epoxy resin and an epoxy resin curing agent, wherein the styrene ratio of the styrene elastomer is less than 30%.

15 Claims, 4 Drawing Sheets

1

(51) Int. Cl.

| | |
|---|---|
| *B32B 25/08* | (2006.01) |
| *B32B 27/00* | (2006.01) |
| *C08L 63/00* | (2006.01) |
| *C08L 71/12* | (2006.01) |
| *C09J 7/22* | (2018.01) |
| *C09J 7/25* | (2018.01) |
| *C09J 7/35* | (2018.01) |
| *C09J 7/38* | (2018.01) |
| *C09J 11/06* | (2006.01) |
| *C09J 151/08* | (2006.01) |
| *C09J 153/02* | (2006.01) |
| *H05K 1/03* | (2006.01) |

(52) U.S. Cl.
CPC .............. *C09J 153/02* (2013.01); *B32B 7/12* (2013.01); *B32B 25/08* (2013.01); *B32B 27/00* (2013.01); *C08L 63/00* (2013.01); *C08L 71/12* (2013.01); *C09J 7/22* (2018.01); *C09J 7/387* (2018.01); *C09J 11/06* (2013.01); *C09J 151/08* (2013.01); *C09J 153/025* (2013.01); *C09J 2203/326* (2013.01); *C09J 2425/00* (2013.01); *C09J 2463/00* (2013.01); *C09J 2467/006* (2013.01); *C09J 2471/00* (2013.01); *H05K 1/03* (2013.01)

(56) References Cited

U.S. PATENT DOCUMENTS

| | | | | |
|---|---|---|---|---|
| 8,703,277 | B2 * | 4/2014 | Tokiwa | C08L 71/12 |
| | | | | 523/427 |
| 9,062,145 | B2 * | 6/2015 | Ohno | C08F 283/06 |
| 10,370,536 | B2 * | 8/2019 | Ueno | C08K 7/18 |
| 10,584,239 | B2 * | 3/2020 | Jung | C08K 9/06 |
| 10,590,272 | B2 * | 3/2020 | Jung | C08L 71/02 |
| 2001/0053450 | A1 * | 12/2001 | Yeager | C08L 71/126 |
| | | | | 525/391 |
| 2002/0028337 | A1 * | 3/2002 | Yeager | C08G 65/485 |
| | | | | 428/461 |
| 2005/0005437 | A1 * | 1/2005 | Nakamura | H05K 3/4661 |
| | | | | 156/239 |
| 2009/0107632 | A1 * | 4/2009 | Lu | C08G 59/68 |
| | | | | 156/330 |
| 2009/0239992 | A1 * | 9/2009 | Yamada | C08L 53/025 |
| | | | | 524/529 |
| 2009/0273070 | A1 * | 11/2009 | Tendou | C08G 59/686 |
| | | | | 257/E23.06 |
| 2009/0309073 | A1 * | 12/2009 | Takagi | C08L 77/02 |
| | | | | 252/511 |
| 2009/0323300 | A1 * | 12/2009 | Fujimoto | C09J 163/00 |
| | | | | 428/355 R |
| 2011/0210407 | A1 * | 9/2011 | Katayama | C08G 73/1046 |
| | | | | 257/E29.166 |
| 2012/0071585 | A1 * | 3/2012 | Nohara | C08J 5/243 |
| | | | | 427/386 |
| 2013/0199961 | A1 | 8/2013 | Sasaki et al. | |
| 2014/0118964 | A1 * | 5/2014 | Nakamura | H05K 3/465 |
| | | | | 361/748 |
| 2015/0195921 | A1 * | 7/2015 | Onodera | H05K 3/4691 |
| | | | | 174/258 |
| 2017/0259544 | A1 * | 9/2017 | Okimura | C09J 153/025 |
| 2018/0179424 | A1 * | 6/2018 | Jeng | C09J 171/12 |
| 2018/0258324 | A1 * | 9/2018 | Tochihira | B32B 27/286 |
| 2019/0241717 | A1 * | 8/2019 | Tanigawa | H05K 1/03 |
| 2020/0001573 | A1 * | 1/2020 | Saito | B32B 5/022 |
| 2021/0040360 | A1 * | 2/2021 | Yamamoto | C08K 5/0025 |
| 2021/0395464 | A1 * | 12/2021 | Akatsuka | C08F 236/06 |
| 2022/0259363 | A1 * | 8/2022 | Saito | B32B 27/30 |
| 2022/0267650 | A1 * | 8/2022 | Yamamoto | B32B 25/08 |

FOREIGN PATENT DOCUMENTS

| | | | | |
|---|---|---|---|---|
| JP | 2004-263099 | A | * | 9/2004 |
| JP | 2004-269785 | A | * | 9/2004 |
| JP | 2010-261003 | A | | 11/2010 |
| JP | 2011-068713 | A | | 4/2011 |
| JP | 2011-228642 | A | | 11/2011 |
| JP | 2015-131866 | A | * | 7/2015 |
| JP | 2016-079354 | A | * | 5/2016 |
| JP | 2016-79354 | A | | 5/2016 |
| JP | 2017-57346 | A | | 3/2017 |
| JP | 2018-001632 | A | | 1/2018 |
| KR | 10-2015-0058352 | A | | 5/2015 |
| KR | 10-2017-0040184 | A | | 4/2017 |
| WO | 2012/049873 | A1 | | 4/2012 |
| WO | 2014/046014 | A1 | | 3/2014 |
| WO | WO 2019/203112 | A1 | * | 9/2019 |
| WO | WO 2020/059562 | A1 | * | 9/2020 |

OTHER PUBLICATIONS

Aug. 26, 2022 Office Action issued in Chinese Patent Application No. 201980098839.4.
Aug. 10, 2023 Office Action issued in Korean Application No. 10-2022-7002763.
Oct. 15, 2019 International Search Report issued in International Patent Application No. PCT/JP2019/030600.

* cited by examiner

<u>13</u>

ADHESIVE COMPOSITION, THERMOSETTING ADHESIVE SHEET, AND PRINTED WIRING BOARD

TECHNICAL FIELD

This technology relates to an adhesive composition, a thermosetting adhesive sheet, and a printed wiring board.

BACKGROUND ART

With the increase in the speed and capacity of information communications, the trend of increasing the frequency of signals flowing through printed circuit boards is accelerating. Accordingly, low dielectric properties such as low dielectric constant and low dielectric loss tangent are required for constituent materials (for example, an adhesive composition) of a rigid substrate or a flexible printed wiring board (FPC) (see PLT 1 and 2, for example).

Although polyphenyleneether has many advantages as a substrate material having low dielectric properties, it lacks folding endurance since polyphenyleneether has a very high melting point (softening point) and a hard property at ordinary temperature. For example, as in the resin composition described in PLT 2, when approximately 30 to 50% of the entire resin is composed of polyphenyleneether, the folding endurance tends to be inferior.

CITATION LIST

Patent Literature

PLT 1: Japanese Unexamined Patent Application Publication No. 2017-57346
PLT 2: Japanese Unexamined Patent Application Publication No. 2016-79354

SUMMARY OF INVENTION

Technical Problem

The present technology has been proposed in view of such conventional circumstances, and provides an adhesive composition, a thermosetting adhesive sheet, and a printed wiring board having a low dielectric constant, a low dielectric loss tangent, and an excellent folding endurance.

Solution to Problem

An adhesive composition according to the present technology includes: with respect to the total of 100 parts by mass of the adhesive composition, 75 to 90 parts by mass of a styrene elastomer; 3 to 25 parts by mass of a modified polyphenyleneether resin having a polymerizable group at an end; and totally 10 parts by mass or less of an epoxy resin and an epoxy resin curing agent, wherein the styrene ratio of the styrene elastomer is less than 30%.

A thermosetting adhesive sheet according to the present technology includes a base material and a thermosetting adhesive layer formed on the base material and composed of the adhesive composition described above.

A printed wiring board according to the present technology includes: a wiring resin substrate having a base material and a wiring pattern; and a cover lay laminated on the wiring pattern of the resin substrate via a cured product of the adhesive composition described above.

Advantageous Effects of Invention

The present technology can provide an adhesive composition having a low dielectric constant, a low dielectric loss tangent, and an excellent folding endurance.

DESCRIPTION OF EMBODIMENTS

Figure 1:
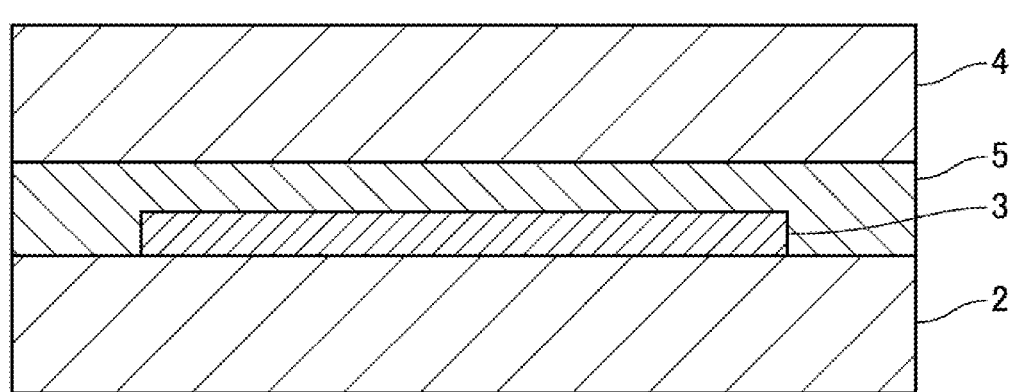
FIG. 1 is a cross-sectional view showing a configuration example of a printed wiring board.

Embodiments of the present technology will be described below. The values of the weight-average molecular weight and the number-average molecular weight of the components described below refer to values calculated from the molecular weight in terms of standard polystyrene measured by the gel permeation chromatography (GPC) method.
Adhesive Composition The adhesive composition according to the present technology is a thermosetting adhesive composition which contains, with respect to the total of 100 parts by mass of the adhesive composition, 75 to 90 parts by mass of a styrene elastomer (Component A), 3 to 25 parts by mass of a modified polyphenyleneether resin having a polymerizable group at an end (Component B; hereinafter simply referred to as modified polyphenyleneether resin), and totally 10 parts by mass or less of an epoxy resin (Component C) and an epoxy resin curing agent (Component D). The adhesive composition according to the present technology has a styrene ratio of less than 30%. This composition can maintain the dielectric constant and the dielectric loss tangent to be low even after thermosetting and can adjust the glass transition temperature of the cured adhesive composition to be low (e.g., in the range of −40 to 40° C.), thereby achieving an adhesive composition having an excellent folding endurance even after thermosetting. Such an adhesive composition can be suitably used as an adhesive (interlayer adhesive) for a flexible printed wiring board, among other applications.
Styrene Elastomer The styrene elastomer is a copolymer of styrene and an olefin (conjugated dienes such as butadiene and isoprene) and/or a hydrogenated product thereof. The styrene elastomer is a block copolymer having styrene as a hard segment and conjugated diene as a soft segment. Examples of styrene elastomers include styrene/butadiene/styrene block copolymers, styrene/isoprene/styrene block copolymers, styrene/ethylene/butylene/styrene block copolymers, styrene/ethylene/propylene/styrene block copolymers, and styrene/butadiene block copolymers. Further, a styrene/ethylene/butylene/styrene block copolymer, a styrene/ethylene/propylene/styrene block copolymer, and a styrene/butadiene block copolymer in which the double bond of the conjugated diene component is eliminated by hydrogenation (also referred to as a hydrogenated styrene elastomer) may be used.

The weight average molecular weight of the styrene elastomer is preferably 100,000 or more, more preferably 100,000 to 150,000, and still more preferably 110,000 to 150,000. Such a configuration can improve peel strength (connection reliability) and heat resistance.

The styrene ratio in the styrene elastomer is preferably less than 30%, more preferably 5 to 30%, still more preferably 5 to 25%, and particularly preferably 10 to 20%. By thus setting the styrene ratio of the styrene elastomer to less than 30%, it is possible to adjust the glass transition temperature of the cured adhesive composition to, e.g., a range of −40 to 40° C., thereby improving the folding endurance. Further, peel strength (connection reliability) and heat resistance can also be improved. On the contrary, when the styrene ratio of the styrene elastomer is 30% or more, the glass transition temperature of the adhesive composition after curing increases to, e.g., 100° C. or more, so that the folding endurance tends to deteriorate.

Particularly, as the styrene elastomer, it is preferable to use a styrene elastomer having a weight-average molecular weight of 100,000 or more (more preferably 110,000 to 150,000) and a styrene ratio of 5 to 25% from the viewpoint of adjusting the glass transition temperature of the cured adhesive composition to a low range and improving the folding endurance.

Specific examples of the styrene elastomer include TUFTEC H 1221 (Mw 120,000, styrene ratio 12%), TUFTEC H 1062 (Mw 116,000, styrene ratio 18%), TUFTEC H 1083 (Mw 103,000, styrene ratio 20%), TUFTEC H 1943 (Mw 100,000, styrene ratio 20%, all of the above manufactured by Asahi Kasei) and HYBRAR 7125 (Mw 110,000, styrene ratio 20%, manufactured by Kuraray). Among these, TUFTEC H 1221 and HYBRAR 7125 are preferable from the viewpoint of molecular weight and styrene ratio.

The content of the styrene elastomer in the adhesive composition may be 75 to 90 parts by mass or 80 to 90 parts by mass with respect to the total of 100 parts by mass of Components A, B, C, and D. The content of the styrene elastomer being less than 75 parts by mass tends to degrade folding endurance. When the content of the styrene elastomer exceeds 90 parts by mass, the content of other components (for example, component B) is relatively small, thereby degrading heat resistance. One type of styrene elastomer may be used alone, or two or more types of styrene elastomer may be used in combination.

Modified Polyphenyleneether Resin

The modified polyphenyleneether resin has a polyphenyleneether chain in the molecule and a polymerizable group at an end. The modified polyphenyleneether resin preferably has two or more of at least one of an epoxy group and an ethylenically unsaturated bond as a polymerizable group in one molecule. In particular, from the viewpoint of compatibility with the styrene elastomer and dielectric properties of the adhesive composition, the modified polyphenyleneether resin preferably has at least one of an epoxy group and an ethylenically unsaturated bond (a (meth)acryloyl group and a vinylbenzyl group, among others) at both ends.

Polyphenyleneether resins not modified by a compound having a polymerizable group, i.e., polyphenyleneether resins having a hydroxyl group at an end are not preferable since they have an excessive polarity and therefore have an inferior compatibility with the styrene elastomer described above, thereby disabling the adhesive composition to be formed into a film.

A modified polyphenyleneether resin having vinylbenzyl groups at both ends, which is an example of the modified polyphenyleneether resin can be obtained, e.g., by producing a bifunctional phenylene ether oligomer by oxidative coupling of a bifunctional phenol compound and a monofunctional phenol compound and then converting the terminal phenolic hydroxyl group of the bifunctional phenylene ether oligomer into vinylbenzyl ether.

The weight-average molecular weight (or number average molecular weight) of the modified polyphenyleneether resin is preferably 1,000 to 3,000 from the viewpoint of compatibility with the styrene elastomer described above and the conformability to the level difference formed when thermally curing (pressing) a cover lay with a wiring pattern side of a wiring resin substrate having a base material and a wiring pattern.

Examples of the modified polyphenyleneether resin include OPE-2 St (modified polyphenyleneether resin having vinylbenzyl groups at both ends), OPE-2 Gly (modified polyphenyleneether resin having epoxy groups at both ends), OPE-2 EA (modified polyphenyleneether resin having acryloyl groups at both ends, all of the above manufactured by Mitsubishi Gas Chemical), and Noryl SA 9000 (modified polyphenyleneether resin having methacryloyl groups at both ends, manufactured by SABIC).

The content of the modified polyphenyleneether resin in the adhesive composition is preferably 3 to 25 parts by mass or 5 to 20 parts by mass, with respect to the total of 100 parts by mass of Components A, B, C, and D. The content of the modified polyphenyleneether resin exceeding 25 parts by mass tends to degrade folding endurance due to the increase in the glass transition temperature of the adhesive composition after curing. In addition, the content of the modified polyphenyleneether resin being 5 parts by mass or more can further improve the heat resistance. One type of polyphenyleneether resin may be used alone, or two or more types of polyphenyleneether resin may be used in combination.

Epoxy Resin

Examples of the epoxy resin include an epoxy resin having a naphthalene backbone, a bisphenol A type epoxy resin, a bisphenol F type epoxy resin, a phenol novolak type epoxy resin, an alicyclic epoxy resin, a siloxane type epoxy resin, a biphenyl type epoxy resin, a glycidyl ester type epoxy resin, a glycidyl amine type epoxy resin, and a hydantoin type epoxy resin, among others. In particular, from the viewpoint of the moldability of the film, it is preferable to use an epoxy resin which is in a liquid state at ordinary temperature, such as an epoxy resin having a naphthalene backbone, a bisphenol A type epoxy resin, or a bisphenol F type epoxy resin. One type of epoxy resin may be used alone, or two or more types of epoxy resin may be used in combination.

Epoxy Resin Curing Agent

The epoxy resin curing agent is a catalyst for promoting the curing reaction of the epoxy resin. The epoxy resin curing agent may be imidazole-based, phenol-based, amine-based, acid anhydride-based, and organic peroxide-based epoxy resin curing agent. In particular, from the viewpoint of the storability (life) of the adhesive composition at ordinary temperature, the epoxy resin curing agent is preferably a latent curing agent and is more preferably an encapsulated imidazole-based curing agent having latent properties. Improved storability at ordinary temperature further facilitates the management in the supply and use of the adhesive composition. Specifically, the epoxy resin curing agent may be a microcapsule-type latent curing agent comprising a latent imidazole-modified substance as a core coated with polyurethane. As a commercial product, e.g., Novacure 3941 (manufactured by ASAHI KASEI E-materials) can be used. One type of epoxy resin curing agent may be used alone, or two or more types of epoxy resin curing agent may be used in combination.

The total content of the epoxy resin and the epoxy resin curing agent in the adhesive composition is 10 parts by mass or less, and preferably 5 parts by mass or less, with respect to the total of 100 parts by mass of Components A, B, C, and D. The total content of the epoxy resin and the epoxy resin curing agent exceeding 10 parts by mass tends to degrade dielectric properties.

Other Components

The adhesive composition may further contain components other than Components A to D described above to the extent that the effect of the present technology is not impaired. Other components include organic solvents, adhesive-imparting agents such as silane coupling agents, and fillers for flowability adjustment and flame retardancy imparting, among others. Although the organic solvent is not particularly limited, examples thereof include an alcohol solvent, a ketone solvent, an ether solvent, an aromatic solvent, and an ester solvent. Among these, aromatic solvents and ester solvents are preferable from the viewpoint of solubility. One type of organic solvent may be used alone, or two or more types of organic solvent may be used in combination.

When using a modified polyphenyleneether resin having an unsaturated bond at an end as a modified polyphenyleneether resin, e.g., as a component other than Components A to D described above, the adhesive composition preferably contains substantially no peroxide as a catalyst for promoting a radical curing reaction of the unsaturated bond at the end. The total content of the peroxide in the adhesive composition is preferably 0.01 mass % or less, more preferably 0.001 mass % or less. With this composition, since the modified polyphenyleneether resin is not substantially crosslinked by heating, the adhesive composition can easily reduce the glass transition temperature after curing, thereby improving the folding endurance. Examples of the peroxide include organic peroxide such as dicumyl peroxide and dilauroyl peroxide, among other peroxides.

Thermosetting Adhesive Sheet

The thermosetting adhesive sheet according to the present technology includes a base material and a thermosetting adhesive layer made of the above-described adhesive composition formed on the base material, and is formed into a film shape. The thermosetting adhesive sheet is obtained, e.g., by diluting the above-described adhesive composition with a solvent, applying the diluted adhesive composition to at least one surface of the base material by, e.g., a bar coater or a roll coater so that the thickness after drying is 10 to 60 μm, and drying the adhesive sheet at a temperature of about 50 to 130° C. The base material may be a release-treated base material in which a base material such as a polyethylene terephthalate film or a polyimide film is appropriately subjected to release treatment with silicone.

The thickness of the thermosetting adhesive layer constituting the thermosetting adhesive sheet can be 1 to 100 μm or 1 to 30 μm as an example, although the thickness may be appropriately set according to the purpose.

Since the thermosetting adhesive layer constituting the thermosetting adhesive sheet is made of an adhesive composition having a low dielectric constant and a low dielectric loss tangent even after thermosetting and an excellent folding endurance even after thermosetting as described above, it can be used, e.g., as an interlayer adhesive of a flexible printed wiring board, and for an application of bonding and fixing a terminal portion of the flexible printed wiring board and a connecting base material for backing the terminal portion. Further, the thermosetting adhesive sheet has an excellent peel strength and heat resistance after thermosetting, and storability at ordinary temperature.

Printed Wiring Board

The printed wiring board according to the present technology includes a wiring substrate having a base material and a wiring pattern, and a cover lay laminated on the wiring pattern of the substrate via a cured product of the adhesive composition (thermosetting adhesive layer) described above. The printed wiring board is obtained, e.g., by arranging a thermosetting adhesive layer of a thermosetting adhesive sheet between the wiring pattern side of the wiring substrate and the cover lay, and performing thermocompression bonding, thereby integrating the wiring substrate and the cover lay.

As with the adhesive composition described above, the wiring substrate preferably has an excellent electrical properties in a high-frequency region, e.g., a low dielectric constant and a low dielectric loss tangent in a frequency region of 1 to 10 GHz. Specific examples of the base material include base materials containing any one of a liquid crystal polymer (LCP), polytetrafluoroethylene, polyimide, and polyethylene naphthalate as a main component. Among these base materials, a base material containing a liquid crystal polymer as a main component (liquid crystal polymer film) is preferable. This is because the liquid crystal polymer has a moisture absorption rate much lower than polyimide and is less susceptible to the use environment.

An example of a configuration of a printed wiring board using an adhesive composition according to the present technology will be described. In the printed wiring board 1 shown in FIG. 1, a copper foil 3 side of a wiring substrate (copper-clad laminate: CCL) provided with a liquid crystal polymer film 2 and the copper foil (rolled copper foil) 3 and a liquid crystal polymer film 4 are laminated via a cured product layer 5 made of the above-described adhesive composition (thermosetting adhesive layer).

Figure 2:
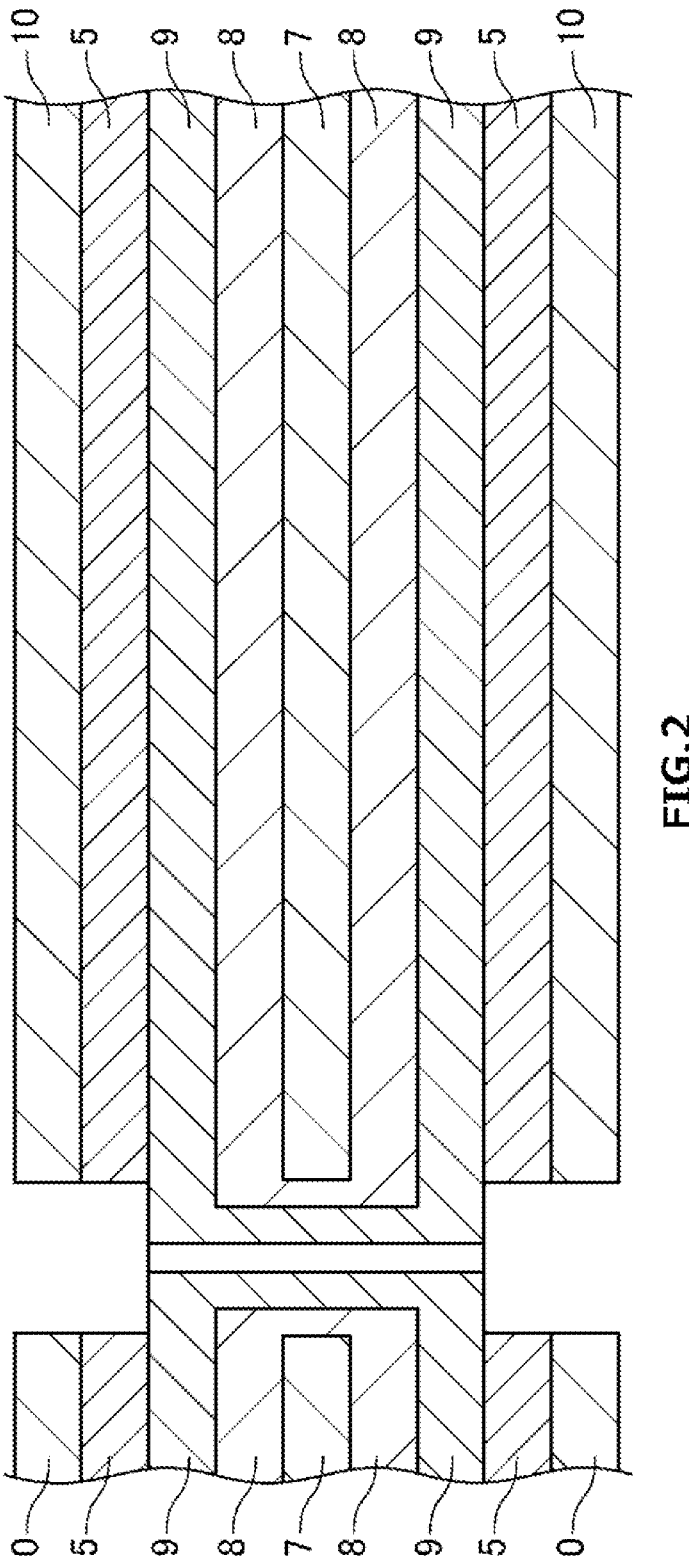
FIG. 2 is a cross-sectional view showing an example of a configuration of a multilayer printed wiring board.

Furthermore, the printed wiring board may have a multilayer structure as shown in FIG. 2, for example. The printed wiring board 6 shown in FIG. 2 includes: a wiring substrate provided with a polyimide layer 7 (25 μm thick), a copper foil 8 (18 μm thick), and a copper plated layer 9 (10 μm thick); and a cover lay 10 (25 μm thick) laminated on the copper plated layer 9 side of the wiring substrate via a cured product layer 5 (35 μm thick) made of the above-described adhesive composition (thermosetting adhesive layer) (total thickness of 201 μm).

EXAMPLES

Examples of the present technology will be described below. However, the present technology is not limited to these examples.

Component A

TUFTEC H 1221: hydrogenated styrene thermoplastic elastomer (Mw 120,000, styrene ratio 12%), manufactured by Asahi Kasei HYBRAR 7125: hydrogenated styrene thermoplastic elastomer (Mw 110,000, styrene ratio 20%), manufactured by Kuraray TUFTEC H 1041: hydrogenated styrene thermoplastic elastomer (Mw 90,000, styrene ratio 30%), manufactured by Asahi Kasei TUFTEC H 1043: hydrogenated styrene thermoplastic elastomer (Mw 110,000, styrene ratio 67%), manufactured by Asahi Kasei Component B OPE-2St2200: modified polyphenyleneether resin having vinylbenzyl groups at both ends (Mn 2,200), manufactured by MITSUBISHI GAS CHEMICAL SA9000: modified polyphenyleneether resin having methacryloyl groups at both ends (Mw 1,700), manufactured by SABIC SA120: polyphenyleneether resin having hydroxyl groups at both ends, manufactured by SABIC S201A: polyphenyleneether resin having hydroxyl groups at both ends, manufactured by Asahi Kasei Component C 4032D: naphthalene epoxy resin, manufactured by DIC JER828: epoxy resin, manufactured by Mitsubishi Chemical YD014: bisphenol A epoxy resin, manufactured by Nippon Steel & Sumitomo Metal Component D Novacure 3941: microcapsule type latent curing agent having imidazole modified substance as a core coated with polyurethane, manufactured by ASAHI KASEI E-materials 2E4MZ: 2-ethyl-4-methylimidazole (non-latent imidazole)

Preparation of Thermosetting Adhesive Composition

The components shown in Table 1 were weighed to obtain the mass shown in Table 1 and uniformly mixed in an organic solvent containing toluene and ethyl acetate to prepare a thermosetting adhesive composition (coating material for forming thermosetting adhesive layer).

Preparation of Thermosetting Sheet

Each of the obtained thermosetting adhesive compositions was applied to a release-treated polyethylene terephthalate film and dried in a drying furnace at 50 to 130° C. to prepare a thermosetting adhesive sheet having the polyethylene terephthalate film and a thermosetting adhesive layer having a thickness of 25 μm.

Evaluation

Evaluation of Coatability (Film State) of Thermosetting Adhesive Layer-Forming Coating During the preparation of the above-described thermosetting sheet, the coatability of the thermosetting adhesive composition was evaluated according to the following criteria. The results are shown in Table 1.

A: The compatibility of the adhesive composition is good, and the evaluation described later can be performed in the film state.

B: The compatibility of the adhesive composition is bad, and the evaluation described later cannot be performed in the film state.

Dielectric Constant

The adhesive sheets prepared in Examples and Comparative Examples were laminated to each other to prepare a test piece having a thickness of 1 mm, and then the test piece was thermally cured at 160° C. and 1.0 MPa for 1 hour to prepare a test piece for evaluation. The dielectric constant of the test piece for evaluation was determined by using a dielectric constant measuring device (manufactured by AET) at a measurement temperature of 23° C. and a measurement frequency of 10 GHz. The results are shown in Table 1.

A: Dielectric constant is less than 2.3.
B: Dielectric constant is 2.3 or more and less than 2.4.
C: Dielectric constant is 2.4 or more and less than 2.6.
D: Dielectric constant is 2.6 or more.

Dielectric Loss Tangent

The dielectric loss tangent of the test piece for evaluation was obtained by the same method as the measurement of the dielectric constant described above. The results are shown in Table 1.

A: Dielectric loss tangent is less than 0.002.
B: Dielectric loss tangent is 0.002 or more and less than 0.0035.
C: Dielectric loss tangent is 0.0035 or more and less than 0.005.
D: Dielectric loss tangent is 0.005 or more.

Peel Strength

The obtained thermosetting adhesive sheet was cut into a strip of a predetermined size (2 cm×5 cm), and the cut thermosetting adhesive layer was temporarily pasted to a liquid crystal polymer film having a size of 2 cm×7 cm×50 μm (thickness) by a laminator set at 100° C., and then the base material (polyethylene terephthalate film) was removed to expose the thermosetting adhesive layer. Upon the exposed thermosetting adhesive layer, a rolled copper foil surface (surface without roughening process) of a copper-clad laminate (CCL consisting of a rolled copper foil with a thickness of 12 μm and a liquid crystal polymer film with a thickness of 50 μm) of the same size was stacked and thermally cured at 160° C. and 1.0 MPa for 1 hour. Thus, samples were prepared.

The obtained samples were subjected to a 90 degree peeling test at a peeling speed of 50 mm/min, and the force required for peeling (initial peel strength and peel strength after reliability test) was measured. The results are shown in Table 1.

Initial peel strength (measured as it is after thermosetting under the above-described conditions of 160° C. and 1.0 MPa)

A: Peel strength is 8 N/cm or more.
B: Peel strength is 6 N/cm or more and less than 8 N/cm.
C: Peel strength is 4 N/cm or more and less than 6 N/cm.
D: Peel strength is less than 4 N/cm.

Peel strength after the reliability test (85° C., 85% RH (relative humidity), 240 hr (that is, after thermosetting under the above-described conditions of 160° C. and 1.0 MPa, the sample is placed in an environment of 85° C. and 85% RH for 240 hours, and measured 3 hours after removal.))

A: Peel strength is 7 N/cm or more.
B: Peel strength is 5 N/cm or more and less than 7 N/cm.
C: Peel strength is 3 N/cm or more and less than 5 N/cm.
D: Peel strength is less than 3 N/cm.

Heat Resistance

The sample was subjected three times through a reflow process with a top temperature of 260° C. for 30 seconds, and the appearance of the sample after passing through the processes was checked to evaluate the presence or absence of peeling or swelling according to the following criteria. The results are shown in Table 1.

A: No abnormality was occurred after the third process.

B: No abnormality was occurred at the second process, and an abnormality such as peeling and swelling was occurred at the third process.

C: No abnormality was occurred after the first process, and an abnormality such as peeling and swelling was occurred after the second process.

D: An abnormality such as peeling and swelling was occurred at the first process.

Folding Endurance

Figure 3:
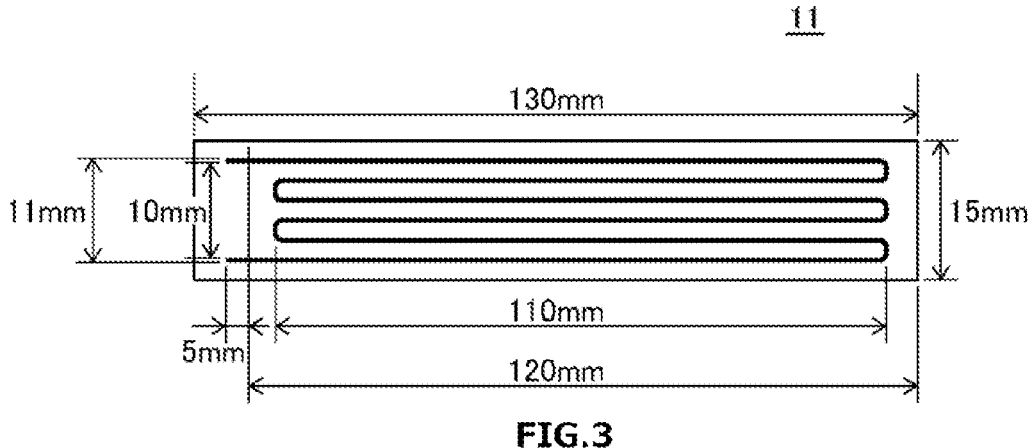
FIG. 3 is a plan view showing an example of a structure of a TEG used in a folding endurance test.
Figure 4:
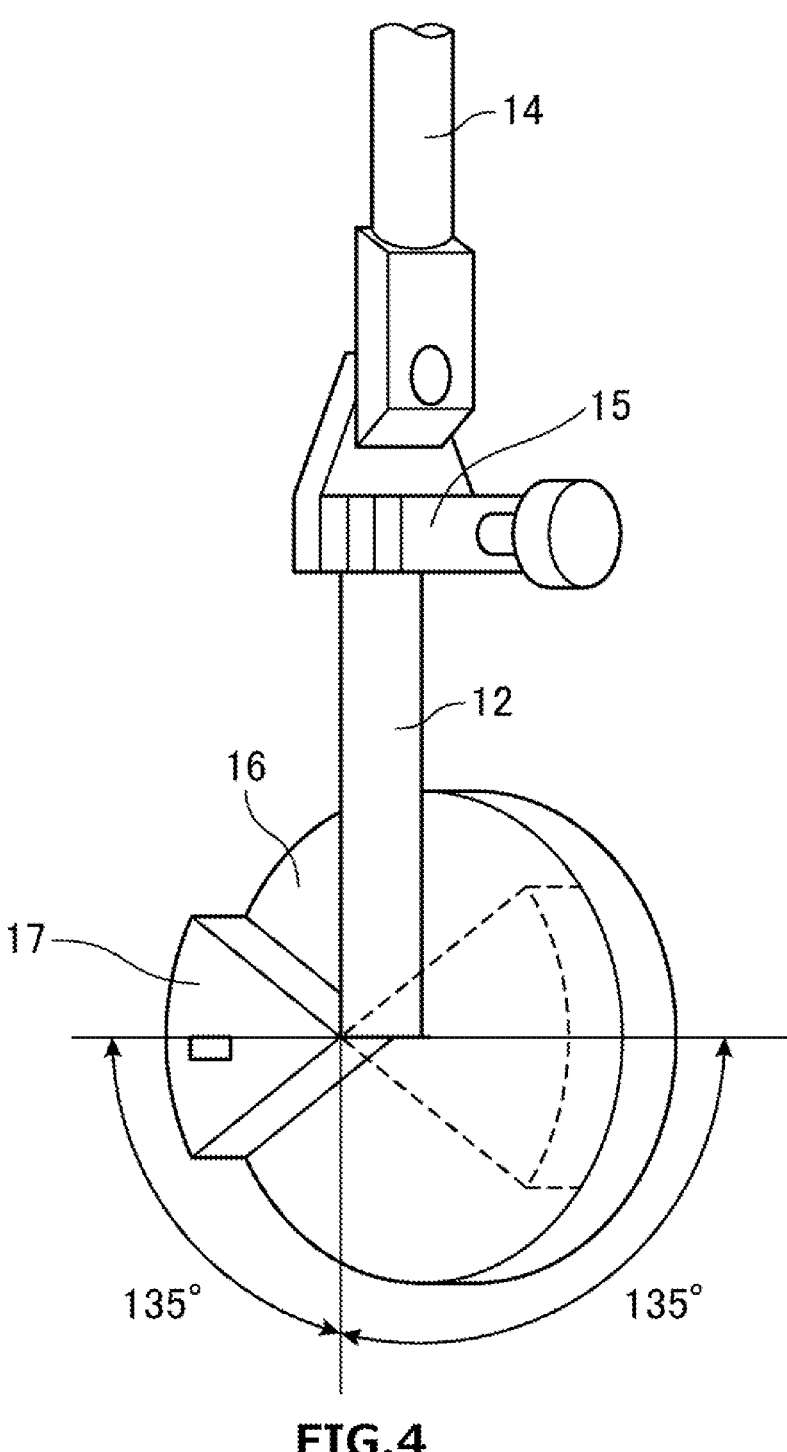
FIG. 4 is a perspective view of a measuring device used in a folding endurance test.

The obtained thermosetting adhesive sheet was cut into a strip of a predetermined size (1.5 cm×12 cm), and the cut thermosetting adhesive layer was temporarily pasted to a liquid crystal polymer film having a size of 1.5 cm×12 cm×50 μm (thickness) by a laminator set at 100° C., and then the base material (polyethylene terephthalate film) was removed to expose the thermosetting adhesive layer. Upon the exposed thermosetting adhesive layer, an FPC-TEG for the MIT folding endurance test was stacked and thermally cured at 160° C. and 1.0 MPa for 1 hour. FIG. 3 shows a structure of the TEG 11 for the MIT folding endurance test. The TEG 11 is formed by forming copper wiring from CCL composed of a liquid crystal polymer film (50 μm thick) as a base material and rolled copper foil (12 μm thick). The MIT folding endurance test was carried out by setting a prepared test piece 12 in a MIT type folding endurance tester 13 having the structure shown in FIG. 4. The test was conducted at a bending angle of 135°, a bending clamp angle R of 0.38, and a test speed of 175 cpm. The number of folds to break the copper wiring was counted. The results are shown in Table 1.

A: The number of folds to break is 1,200 or more.

B: The number of folds to break is 600 or more and less than 1,200.

C: The number of folds to break is 300 or more and less than 600.

D: The number of folds to break is less than 300.

Life Evaluation

After the thermosetting sheet was stored at ordinary temperature for four months, the same evaluation as the above-described evaluation of the peel strength was performed. The reduction rate was determined by comparing with the peel strength evaluated immediately after the thermosetting adhesive sheet was prepared. The results are shown in Table 1.

A: Decrease in peel strength is less than 10%.

B: Decrease in peel strength is 10% or more and less than 30%.

C: Decrease in peel strength is 30% or more.

Glass Transition Temperature

The thermosetting adhesive sheets produced in the Examples and Comparative Examples were laminated together to produce a test piece having a thickness of 600 μm, and the test piece was thermally cured at 160° C. and 1.0 MPa for 1 hour to produce a test piece for evaluation. Using this test piece, the glass transition temperature, which appeared when the temperature was raised from −60° C. to 250° C. at a rate of 10° C./min, was determined by using a dynamic viscoelasticity measuring device manufactured by TA Instruments). In the case of a copolymer or a mixture of a large number of components, a plurality of tan δ peaks may be detected, and in this case, the temperature of the tan δ peak having a larger value (having a larger change in the elastic modulus) was regarded as the glass transition temperature. The results are shown in Table 1.

TABLE 1

| | | Ex. 1 | Ex. 2 | Ex. 3 | Ex. 4 | Ex. 5 | Ex. 6 | Ex. 7 | Ex. 8 |
|---|---|---|---|---|---|---|---|---|---|
| Component A | TUFTEC H1221 (styrene ratio 12% Mw = 120,000) | 75 | 0 | 80 | 0 | 0 | 60 | 92 | 75 |
| | HYBRAR 7125 (styrene ratio 20% Mw = 110,000) | 0 | 80 | 0 | 90 | 80 | 0 | 0 | 0 |
| | TUFTEC H1041 (styrene ratio 30% Mw = 90,000) | 0 | 0 | 0 | 0 | 0 | 0 | 0 | 0 |
| | TUFTEC H1043 (styrene ratio 67% Mw = 110,000) | 0 | 0 | 0 | 0 | 0 | 0 | 0 | 0 |
| Component B | OPE-2St2200 | 20 | 15 | 5 | 0 | 0 | 35 | 3 | 10 |
| | SA9000 | 0 | 0 | 10 | 5 | 15 | 0 | 0 | 0 |
| Component B' | SA120 | 0 | 0 | 0 | 0 | 0 | 0 | 0 | 0 |
| | S201A | 0 | 0 | 0 | 0 | 0 | 0 | 0 | 0 |
| Component C | 4032D | 2 | 2 | 2 | 2 | 0 | 2 | 2 | 5 |
| | JER828 | 0 | 0 | 0 | 0 | 3 | 0 | 0 | 0 |
| | YD014 | 0 | 0 | 0 | 0 | 0 | 0 | 0 | 0 |
| Component D | Novacure 3941 | 3 | 3 | 3 | 3 | 2 | 3 | 3 | 10 |
| | 2E4MZ | 0 | 0 | 0 | 0 | 0 | 0 | 0 | 0 |
| Total | | 100 | 100 | 100 | 100 | 100 | 100 | 100 | 100 |
| Film state | | A | A | A | A | A | A | A | A |
| Dielectric properties | Dk | A | A | A | A | A | B | A | C |
| | Df | A | B | A | B | B | B | A | D |
| Peel | Cu/Cu initial | B | A | A | A | A | B | A | A |
| | Cu/Cu reliability | B | B | A | B | B | C | A | A |
| Heat resistance | | A | A | A | B | A | A | D | A |
| Folding endurance | | A | A | A | A | A | D | A | A |
| Life | | A | A | A | A | A | A | A | A |
| Tg | | −20° C. | −20° C. | −20° C. | −20° C. | −10° C. | 100° C. | −25° C. | −20° C. |

TABLE 1-continued

| | | Ex. 9 | Ex. 10 | Ex. 11 | Ex. 12 | Ex. 13 | Ex. 14 |
|---|---|---|---|---|---|---|---|
| Component A | TUFTEC H1221 (styrene ratio 12% Mw = 120,000) | 0 | 0 | 80 | 80 | 80 | 80 |
| | HYBRAR 7125 (styrene ratio 20% Mw = 110,000) | 0 | 0 | 0 | 0 | 0 | 0 |
| | TUFTEC H1041 (styrene ratio 30% Mw = 90,000) | 80 | 0 | 0 | 0 | 0 | 0 |
| | TUFTEC H1043 (styrene ratio 67% Mw = 110,000) | 0 | 80 | 0 | 0 | 0 | 0 |
| Component B | OPE-2St2200 | 5 | 5 | 0 | 0 | 5 | 5 |
| | SA9000 | 10 | 10 | 0 | 0 | 10 | 10 |
| Component B' | SA120 | 0 | 0 | 15 | 0 | 0 | 0 |
| | S201A | 0 | 0 | 0 | 15 | 0 | 0 |
| Component C | 4032D | 2 | 2 | 2 | 2 | 0 | 2 |
| | JER828 | 0 | 0 | 0 | 0 | 0 | 2 |
| | YD014 | 0 | 0 | 0 | 0 | 2 | 0 |
| Component D | Novacure 3941 | 3 | 3 | 3 | 3 | 3 | 0 |
| | 2E4MZ | 0 | 0 | 0 | 0 | 0 | 1 |
| Total | | 100 | 100 | 100 | 100 | 100 | 100 |
| Film state | | A | A | A | B | A | A |
| Dielectric properties | Dk | A | B | C | — | A | A |
| | Df | A | B | C | — | A | A |
| Peel | Cu/Cu initial | B | D | C | — | B | A |
| | Cu/Cu reliability | C | D | D | — | C | A |
| Heat resistance | | C | B | D | — | B | A |
| Folding endurance | | C | D | D | — | B | A |
| Life | | A | A | A | — | A | C |
| Tg | | 100° C. | 120° C. | −10° C. | — | −20° C. | −20° C. |

From the results shown in Table 1, it was revealed that the adhesive composition containing, with respect to the total of 100 parts by mass of the adhesive composition, 75 to 90 parts by mass of a styrene elastomer (Component A), 3 to 25 parts by mass of a modified polyphenyleneether resin having a polymerizable group at an end (Component B), and 10 parts by mass or less of an epoxy resin (Component C) and an epoxy resin curing agent (Component D) in total, the styrene ratio of the styrene elastomer being less than 30%, had a low dielectric constant and a low dielectric loss tangent even after thermosetting, and had an excellent folding endurance since the glass transition temperature of the cured adhesive composition can be adjusted to a range of −40 to 40° C.

From the result of Example 6, it was found that the content of the modified polyphenyleneether resin being more than 25 parts by mass would degrade the folding endurance since the glass transition temperature increased to 100° C.

From the results of Example 8, it was found to be difficult to reduce the dielectric loss tangent when the total amount of the epoxy resin and the epoxy resin curing agent exceeds 10 parts by mass.

From the results of Examples 9 and 10, it was found that the styrene ratio of the styrene elastomer being 30% or more increases the glass transition temperature to 100 to 120° C., thereby making it difficult to improve the folding endurance.

From the results of Examples 11 and 12, it was found that a polyphenylene ether resin having a hydroxyl group at an end would degrade dielectric properties and folding endurance as in Example 11, or would degrade the film condition as in Example 12, making it impossible to evaluate the dielectric constant, the dielectric loss tangent, the peel strength, the heat resistance, and the folding endurance.

From the results of Examples, it was found that the content of the modified polyphenyleneether resin being 5 to 20 parts by mass would reduce the dielectric constant and dielectric loss tangent, improve the folding endurance, and also improve the heat resistance.

From the results of Examples, it was found that the mass average molecular weight of the styrene elastomer being 100,000 or more could improve the peel strength, the heat resistance, and the folding endurance.

From the results of Examples, it was found that the styrene ratio of the styrene elastomer being less than 30% could improve the dielectric properties, the peel strength, heat resistance, and the folding endurance.

From the results of Examples, it was found that the peel strength, the heat resistance, and the folding endurance could be improved by using a liquid epoxy resin.

From the results of Examples, it was found that the storability at ordinary temperature could be improved by using a latent epoxy resin curing agent.

From the results of Examples 3, 7, and 14, it was found that, in spite of extremely low values such as a dielectric constant (Dk) of 2.3 or less and a dielectric loss tangent (Df) of less than 0.002 at 10 GHz, a very high adhesive strength of 8 N/cm or more could be achieved for a liquid crystal polymer film and a rolled copper foil not subjected to a surface roughening process.

REFERENCE SIGNS LIST 1 printed wiring board, 2 liquid crystal polymer film, 3 copper foil, 4 liquid crystal polymer film, 5 cured product layer composed of adhesive composition, 6 printed wiring board, 7 polyimide layer, 8 copper foil, 9 copper plating layer, 10 cover lay, 11 TEG, 12 test piece, 13 MIT type folding endurance tester, 14 plunger, 15 upper chuck, 16 rotary chuck, 17 bending top

The invention claimed is:

1. An adhesive composition, comprising: with respect to the total of 100 parts by mass of the adhesive composition, 75 to 90 parts by mass of a styrene elastomer, 3 to 25 parts by mass of a modified polyphenyleneether resin having a polymerizable group at an end; and totally more than 0 parts by mass and no more than 10 parts by mass of both a liquid epoxy resin and an epoxy resin curing agent, wherein the styrene ratio of the styrene elastomer is less than 30%, and wherein the glass transition temperature after curing is-40 to 40° C.

2. The adhesive composition according to claim 1, wherein the styrene ratio of the styrene elastomer is 5 to 25%.

3. The adhesive composition according to claim 2, wherein the styrene elastomer has a weight average molecular weight of 100,000 or more.

4. The adhesive composition according to claim 2, wherein the content of the modified polyphenyleneether resin is 5 to 20 parts by mass.

5. The adhesive composition according to claim 2, wherein the modified polyphenyleneether resin has at least one of an epoxy group and an ethylenically unsaturated bond at an end.

6. The adhesive composition according to claim 1, wherein the styrene elastomer has a weight average molecular weight of 100,000 or more.

7. The adhesive composition according to claim 6, wherein the content of the modified polyphenyleneether resin is 5 to 20 parts by mass.

8. The adhesive composition according to claim 6, wherein the modified polyphenyleneether resin has at least one of an epoxy group and an ethylenically unsaturated bond at an end.

9. The adhesive composition according to claim 1, wherein the content of the modified polyphenyleneether resin is 5 to 20 parts by mass.

10. The adhesive composition according to claim 1, wherein the modified polyphenyleneether resin has at least one of an epoxy group and an ethylenically unsaturated bond at an end.

11. The adhesive composition according to claim 1, wherein the adhesive composition comprises 0.01 mass % or less of peroxide.

12. The adhesive composition according to claim 1, wherein the epoxy resin curing agent is a latent epoxy resin curing agent.

13. A thermosetting adhesive sheet comprising a base material and a thermosetting adhesive layer formed on the base material and composed of the adhesive composition according to claim 1 formed on the base material.

14. A printed wiring board comprising: a wiring resin substrate having a base material and a wiring pattern; and a cover lay laminated on the wiring pattern of the resin substrate via a cured product of the adhesive composition according to claim 1.

15. The printed wiring board according to claim 14, wherein the base material is a liquid crystal polymer film.

* * * * *